APPARATUS FOR COOLING ELECTRICAL COMPONENTS

Filed March 20, 1967 2 Sheets-Sheet 1

*INVENTORS*
ROHINTON J. SURTY
JAK TARANTO

*BY* [signature]

*ATTORNEY*

Oct. 8, 1968 R. J. SURTY ETAL 3,405,323

APPARATUS FOR COOLING ELECTRICAL COMPONENTS

Filed March 20, 1967 2 Sheets-Sheet 2

United States Patent Office 3,405,323
Patented Oct. 8, 1968

3,405,323

APPARATUS FOR COOLING ELECTRICAL COMPONENTS

Rohinton J. Surty and Jak Taranto, Menlo Park, Calif., assignors to International Business Machines Corporation, Armonk, N.Y., a corporation of New York Filed Mar. 20, 1967, Ser. No. 624,549
9 Claims. (Cl. 317—100)

ABSTRACT OF THE DISCLOSURE

This cooling system for an electronic assembly includes studs affixed to the components to be cooled. The studs fit into a heat sink which is adapted to have a liquid circulated therein. A low melting point material bonds the studs to the walls of the heat sink. Insertion or removal of the studs is accomplished by heating the fluid within the heat sink to melt the bonding material.

*Field of Invention*

This invention relates generally to cooling systems for electronic devices and more particularly to an arrangement for mounting and cooling an integrated circuit.

*Description of prior art*

The use of high density integrated circuit assemblies in digital computers provides several functional advantages. Perhaps the most significant is that the small size of the individual circuits allows a large number of such circuits to be located on a single semiconductor chip. The resulting shorter leads between circuits on the same chip provide faster operation of the overall system. However, the connections between the semiconductor chips must also be very short if the full potential of large scale integration is to be realized. When a large number of chips are brought together in a closely spaced array, heat dissipation is a very significant problem. A typical array of 625 chips arranged in a 25 by 25 matrix would dissipate upwards of 1200 watts. Since chips may be only 50–100 mils square and dissipate from 2–5 watts, the usual cooling techniques are inadequate.

Ordinary air cooling, even with the assistance of finned radiators, is inadequate in such situations to hold the temperature to a satisfactorily low value. While complete immersion of the chip in cooling medium might be adequate from the cooling standpoint, it introduces severe limitations on the serviceability of the machine. Furthermore, the fact that immersion coolants must not react with any of the compounds they contact, severely limits the choice of coolants and the materials within the machine. Even where semi-inert coolants can be found, the coolant and the circuits must be confined within a closed system to prevent the loss of coolant. In such arrangements the cooling system must be drained before servicing the machine, a time consuming operation. Furthermore, some coolant is lost each time the system is drained leading to the expense of replacement.

Another approach would be to bring the individual circuits in close contact with a large heat sink. The small size of a chip only 50 to 100 mils on a side makes it almost impossible to achieve the accurate positioning required to assure initimate contact over the entire surface of each chip. But, even if good contact could be obtained, the temperature drop through the junction of the chip and the heat sink would be excessive in view of the heat flux which must be transmitted. Furthermore, even if such accuracy were attainable, it is likely that assembly and disassembly would have to be performed under exacting conditions. Since computers having large scale integration type circuits commonly have the circuit assemblies installed after the computer reaches the permanent site, the installation would become exceedingly difficult. When a circuit is replaced, the whole routine of disassembly and assembly would have to be repeated, thus making the approach somewhat impractical.

*Summary of the invention*

The present invention provides a cooling system which allows an electronic component to be mechanically mounted to a heat sink for good thermal conduction, and also to be easily removed from the heat sink. These features are provided without the necessity for high accuracy positioning of the component by filling the interstices between the component and the heat sink with a material having a good thermal conductivity and relatively low melting point.

Assembly of the components into the heat sink is accomplished by raising the temperature of the heat sink to melt the interstitial material. The components are inserted into the heat sink and the temperature is lowered to solidify the material. Since accurate positioning is not necessary, the operation can be performed at any time without complex equipment.

It is therefore an object of this invention to provide an improved cooling system for an electronic system.

It is another object of this invention to provide a cooling system for large scale integrated circuits.

Still another object of this invention is to provide an integrated circuit cooling system which accommodates reasonable positioning tolerances for the chips.

A still further object of this invention is to provide a cooling system for an integrated circuit array which is quickly and easily assembled and disassembled.

The foregoing and other objects, features and advantages of the invention will be apparent from the following more particular description of preferred embodiments of the invention, as illustrated in the accompanying drawings.

*Description of the preferred embodiments*

Figures 1, 1A, 1B:
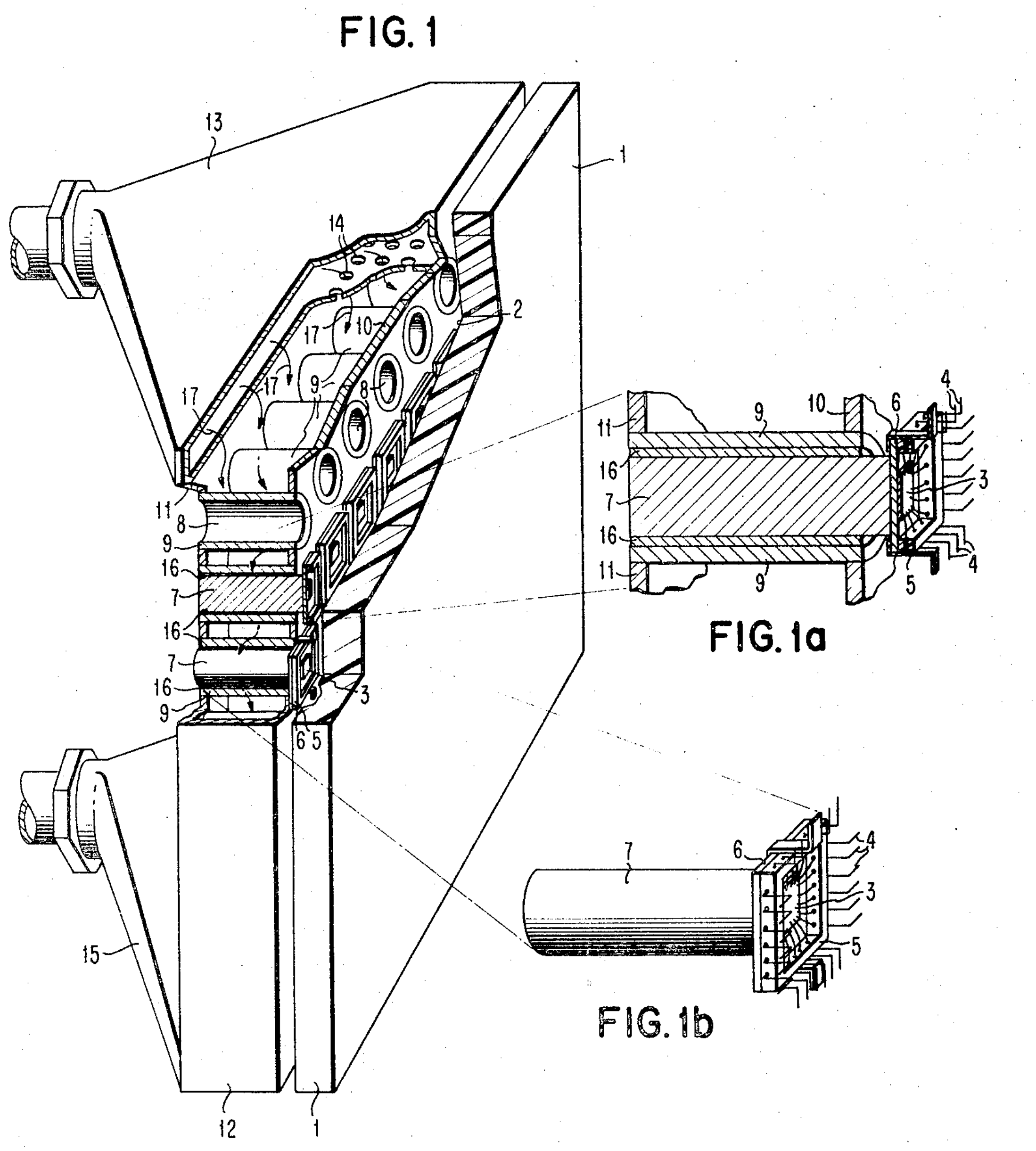
FIGURE 1 is a perspective view of the cooling assembly with parts cut away.
FIGURES 1*a* and 1*b* are exploded views of the semiconductor chip and cooling stud.

The embodiment shown in FIGURE 1 includes a circuit board 1 having the conventional plated wiring arranged in layers within the circuit board and also on the surface 2. The wiring on surface 2 provides means for interconnecting the semiconductor chips 3. Each semiconductor chip 3 contains a plurality of electronic circuits. Connections to the circuits are made by means of leads 4. These leads also serve to support the semiconductor chip 3 on circuit board 1. As shown in FIGURE 1*a* and FIGURE 1*b*, the leads 4 are supported by means of a ceramic collar 5 which, in turn, is bonded to a pad or chip carrier 6 made of a material such as molybdenum, which has a coefficient of thermal expansion close to that of a silicon chip. The chip carrier 6 in turn is bonded to a cooling stud 7 made of a material having high thermal conductivity, such as copper. Returning to FIGURE 1, each of cooling studs 7 fits into one of wells 8 which are made by securing a tube 9 to a pair of head plates 10 and 11. Tubes 9 will normally be of a material having high thermal conductivity, such as copper, while head plate 10 and desirably head plate 11 will be made of a material having a very low coefficient of thermal expansion such as nickel steel.

Head plates 10 and 11 together with tubes 9 make up a heat sink 12. An input manifold 13, having a plurality of distribution holes 14, supplies a flow of coolant 17 from a refrigeration system to the chamber within heat sink 12. Water has been found to be a satisfactory coolant. The water flow rate is made high enough to ensure that the turbulent flow point is reached. This provides uniform cooling of all tubes 9 and therefore also all studs 7. An output manifold 15 conveys the coolant from the exit side of the system back to a refrigeration system which removes heat from the water.

As pointed out previously, the difficulty of aligning a large number of very small components with sufficient accuracy so as to be able to insert them simultaneously into a plurality of wells, precludes the existence of a good mechanical contact between the tube 9 and the cooling stud 7. Even a slight imperfection in the mechanical contact between the stud 7 and tube 9 will result in very poor heat conduction from the stud to the coolant flowing within heat sink 12. To avoid this problem, a low melting point material 16 is used to fill the interstices between the cooling stud 7 and tube 9.

This interstitial material 16 can be inserted in a number of ways depending upon the nature of heat sink 12. The most satisfactory approach is to circulate hot water through heat sink 12 to bring the temperature of the entire assembly above the melting point of the low melting point material.

When the temperature of heat sink 12 reaches a high enough value, the small pieces of the material 16 introduced into the open wells 8 will melt. When all wells 8 have been so loaded and the material 16 has melted, circuit board 1 is positioned to provide alignment between the cooling studs 7 and the wells 8 and gently pushed into place. When the entire assembly has seated, the hot water is flushed from the system and cold water is circulated to solidify the low melting point interstitial material 16, thus providing a good thermal connection between cooling studs 7 and tube 9 as well as providing a mechanical support for the individual cooling studs and the associated semiconductor chips 3.

The preferred embodiment utilizes a water cooled heat sink and therefore is particularly well adapted to the manipulation of temperature by means of the flow of a hot or cold fluid. In other embodiments it may not be possible to vary the coolant temperature in this manner. It would be necessary in such cases to have some means such as resistance wire heaters within heat sink 12 to raise the temperature.

The advantage of water for heating and cooling is that the temperature of heat sink 12 can be accurately controlled. This avoids damage to chips 3 caused by excessive temperature.

The selection of proper materials for the various components of the system contributes to overall performance. Copper is suggested for cooling stud 7. An alloy having a melting point of approximately 135° F., sold under the trademark Cerrolow by the Cerro Sales Corporation has been successfully used for the interstitial material 16.

The interstitial material 16 may be selected from a group of low temperature alloys including indium, bismuth, tin, lead, etc. The primary requirements are a good thermal conductivity and a melting point which is below that which would damage the components being cooled. A minimum value for the thermal conductivity is, of course, dependent upon the amount of heat which must be removed. In general, the thermal conductivities of the low temperature alloys run substantially higher than 1/B.t.u./hr./sq. ft./degree F. Typical conductivity values for greases used in heat sink applications lie in the range of .2 to .7/B.t.u./hr./sq. ft./degree F.

Another satisfactory combination is that the use of tungsten or anodized aluminum for stud 7 and gallium for the interstitial material 16. Tungsten has the advantage of closely matching silicon's coefficient of thermal expansion so the molybdenum pad 6 could be eliminated. Gallium is advantageous since it wets the surface of anodized aluminum to improve heat transfer.

The ceramic collar 5 is bonded to molybdenum pad 6 by conventional glass-to-metal sealing techniques. The semiconductor chip 3 is bonded to molybdenum pad 6 by metalizing the abutting surfaces with gold and baking the assembly.

The bonding of copper tubes 9 and head plates 10 and 11 can be done by means of a brazing material of nickel and gold sold under the trademark Nioro by the Western Gold and Platinum Company.

Head plates 10 and 11 can be fabricated from a steel containing 36% nickel sold under the trademark Invar by the International Nickel Company.

The drawing shows stud 7 as cylindrical, but other geometries can be used; for example, it has been found that the system is somewhat easy to assemble if stud 7 is slightly tapered to provide a smaller diameter at the end opposite the semiconductor chip. Other geometries could be used for the stud such as a hemispherical shape or more sharply truncated cone.

While wells 8 are shown as open on both ends, it is possible to provide a well having one end closed. This has been found to be a less desirable configuration since the interstitial material 16 tends to be expelled by air which is entrapped as the cooling studs are pushed down into the well. The open-end well as shown in FIGURE 1 does not suffer from this disadvantage. Furthermore, the tendency for the interstitial material 16 to drain from the wells in the molten state, is not as great as might be expected. The surface tension of this material is generally sufficient to hold it within the well. Typical dimensions for the cooling stud have been found to be 90 mils in diameter and ranging from ¼ to ⅜ of an inch long. The length is ideally about three times the diameter. The spacing between the wall of the well 8 and the cooling stud 7 is approximately 10 mils, depending upon the positioning error. Chip carrier 6 is approximately 10 mils in thickness.

Figure 2A:
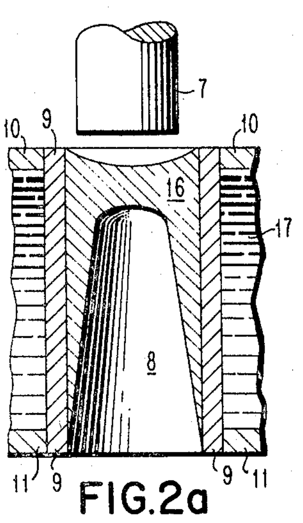
FIGURES 2*a*, 2*b* and 2*c* show three stages in joining the cooling stud to the heat sink.
Figure 2B:
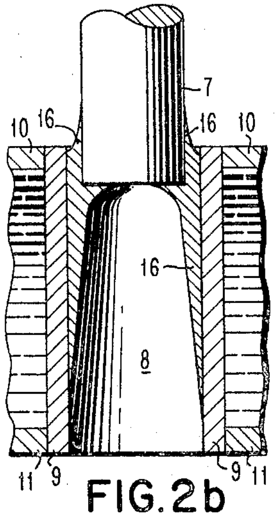
Figure 2C:
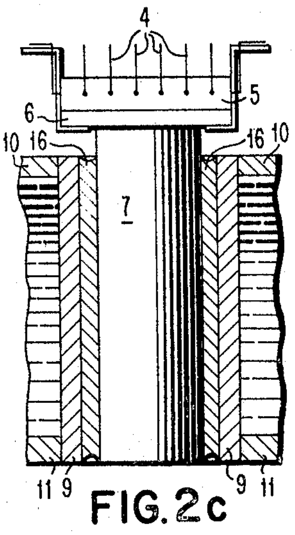

FIGURES 2*a*, 2*b* and 2*c* show the behavior of the interstitial material 16 at three stages in the mounting process. In FIGURE 2*a* the material has been melted by the heated fluid 17 circulated in heat sink 12. Stud 7 is poised in alignment with well 8. In FIGURE 2*b* the lower end of stud 7 has entered well 8. The material 16 wets the surface of stud 7 causing it to climb the walls slightly. In FIGURE 2*c* the assembly is complete. The heated fluid has been exchanged for coolant and the interstitial material 16 has solidified to securely bond stud 7 to the walls of well 8.

In practice, each of these steps would be performed on all studs at the same time. Thus, it would take no more time to assembler a 50 x 50 matrix than a 25 x 25 matrix.

Figure 3:
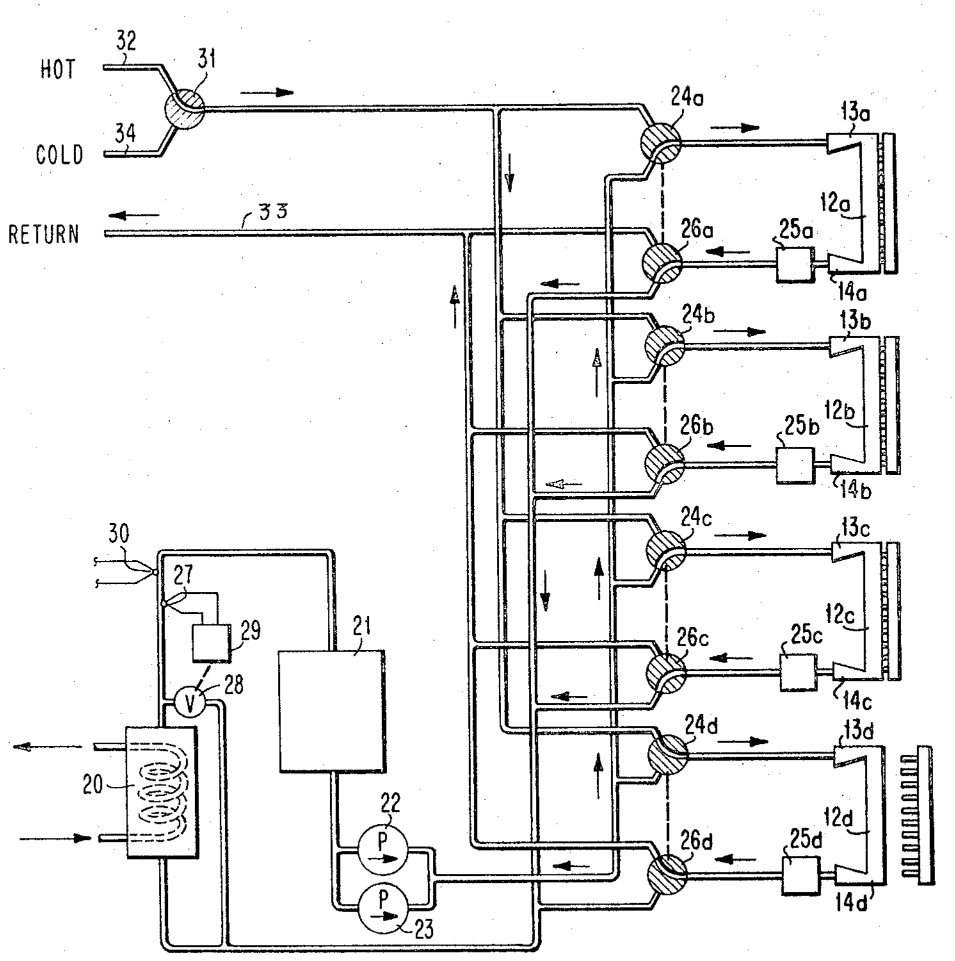
FIGURE 3 is a schematic drawing of the coolant flow and control circuits for the system.

The coolant system and the controls for the flow of coolant are shown in FIGURE 3. The heat sinks **12*a*, 12*b*, 12*c* and 12*d* have their input manifolds 13*a*, 13*b*, 13*c* and 13*d* connected to be supplied with cooling fluid from heat exchanger 20 through expansion tank 21, pumps 22 and 23 and valves 24*a*, 24*b*, 24*c* and 24*d*. The output manifolds 14*a*, 14*b*, 14*c* and 14*d* are connected through fail-safe flow meters 25*a*, 25*b*, 25*c* and 25*d* to a second set of valves 26*a*, 26*b*, 26*c* and 26*d*, and then to the heat exchanger 20. A thermocouple 27 is positioned to measure the temperature of the coolant at the input to expansion tank 21. Controller 29 positions valve 28. In response to the signal from thermocouple 27, valve 28 mixes the relatively high temperature coolant flowing from the heat sinks 12 with the relatively low temperature coolant at the output of the heat exchanger 20** to hold the coolant supplied to the heat sinks at the desired temperature.

The output of each of the fail-safe flow meters **25*a*, 25*b*, 25*c* and 25*d* is monitored to shut down the electronic circuits associated with the individual heat sinks should the flow of coolant be interrupted. Similarly, should the temperature monitored by thermocouple 30 at the input to the expansion tank 21** rise above a safe point, the entire computer system may be shut down.

While one pump 22 or 23 would be sufficient from the standpoint of the flow required for cooling purposes, two pumps are connected in parallel to provide an additional measure of realibility. The valves 24*a*–24*d* and 26*a*–26*d* are connected so that each of the sinks 12*a*–12*d* may be connected to an external fluid supply. In the situation where an integrated circuit has failed and it is necessary to remove a circuit board 1 from its associated heat sink 12, the valves associated with the heat sink having the defective circuit are positioned to transfer the heat sink to the external supply.

Heat sink 12*d* has its associated valves 24*d* and 26*d* positioned to disconnect it from the cooling system and connect it to the external supply.

To melt the interstitial material 16, the selector valve 31 is positioned to run hot water from feed line 32 through valve 24*d*, heat sink 12*d*, flow meter 25*d*, and valve 26*d* to the return line 33. When the temperature of the interstitial material 16 has reached a point where removal of the printed circuit board 1 and the associated cooling studs is possible, the board is extracted from the heat sink. After the defective chip has been replaced, the hot water is again circulated in the manner previously described to bring the temperature of the heat sink to a point above the melting point of the interstitial material 16. The circuit board and associated cooling studs is then reinserted into the heat sink and valve 31 is turned to where it supplies cold water from feed line 34 to heat sink 12*d*. This results in the solidification of the interstitial material 16. When this has been achieved, three-way valves 24*d* and 26*d* may be returned to the normal position so that coolant is supplied from expansion tank 21. Operation of the computer system may then be resumed.

While the invention has been particularly shown and described with reference to preferred embodiments thereof, it will be understood by those skilled in the art that the foregoing and other changes in form and details may be made therein without departing from the spirit and scope of the invention.

We claim:

1. An electronic assembly comprising:

a circuit board, a plurality of electronic components connected to said board, a cooling stud fastened to each of said components;

a heat sink, said sink having a chamber for the flow of liquid, a plurality of wells in said sink, said wells having a shape and location complementary to said studs; and a material having a low melting point and good thermal conductivity bonding said studs to the walls of said wells.

2. An electronic assembly according to claim 1 wherein said studs are generally cylindrical and said wells are tubular in shape.

3. An electronic assembly according to claim 2 wherein the length of each said stud is approximately 3 times the diameter of each said stud.

4. An electronic assembly according to claim 1 wherein said studs are copper.

5. An electronic assembly according to claim 1 wherein said studs are tungsten.

6. An electronic assembly according to claim 1 wherein said wells are open at both ends.

7. An electronic assembly according to claim 1 wherein said sink has a portion lying parallel and adjacent to said board and said portion is of a material having substantially zero coefficient of thermal expansion.

8. An electronic assembly according to claim 4 including a layer of molybdenum intermediate each said stud and each component of said components.

9. An electronic assembly according to claim 1 wherein said low melting point material has a melting point below 212° F. and a thermal conductivity greater than 1 B.t.u./hr./sq. ft./degree F.

References Cited

UNITED STATES PATENTS

| | | | |
|---|---|---|---|
| 2,829,271 | 4/1958 | Boucher | 250—89 |
| 2,912,624 | 11/1959 | Wagner | 317—100 |
| 2,937,437 | 5/1960 | Cole et al. | 29—424 |
| 3,266,562 | 8/1966 | Navarro | 165—47 |
| 2,845,516 | 7/1958 | Jones | 29—629 |
| 3,275,921 | 9/1966 | Fellendorf et al. | 317—234 |

FOREIGN PATENTS

| | | |
|---|---|---|
| 914,034 | 12/1962 | Great Britain. |

ROBERT K. SCHAEFER, *Primary Examiner.*

M. GINSBURG, *Assistant Examiner.*